(12) United States Patent
Park et al.

(10) Patent No.: US 11,682,633 B2
(45) Date of Patent: Jun. 20, 2023

(54) SEMICONDUCTOR PACKAGE

(71) Applicant: Samsung Electronics Co., Ltd., Suwon-si (KR)

(72) Inventors: Ji-Yong Park, Hwaseong-si (KR); Duckgyu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 103 days.

(21) Appl. No.: 17/181,617

(22) Filed: Feb. 22, 2021

(65) Prior Publication Data

US 2022/0013476 A1    Jan. 13, 2022

(30) Foreign Application Priority Data

Jul. 13, 2020  (KR) ........................ 10-2020-0086278

(51) Int. Cl.
| | |
|---|---|
| *H01L 23/00* | (2006.01) |
| *H01L 23/31* | (2006.01) |
| *H01L 23/367* | (2006.01) |
| *H01L 23/498* | (2006.01) |

(52) U.S. Cl.
CPC ........ *H01L 23/562* (2013.01); *H01L 23/3185* (2013.01); *H01L 23/367* (2013.01); *H01L 23/4985* (2013.01); *H01L 23/49838* (2013.01); *H01L 24/16* (2013.01); *H01L 2224/16227* (2013.01); *H01L 2924/18161* (2013.01); *H01L 2924/351* (2013.01)

(58) Field of Classification Search
CPC . H01L 23/562; H01L 23/3185; H01L 23/367; H01L 23/49838; H01L 23/4985; H01L 24/16; H01L 2224/16227; H01L 2924/18161; H01L 2924/351

See application file for complete search history.

(56) References Cited

U.S. PATENT DOCUMENTS

| | | |
|---|---|---|
| 8,575,746 B2 | 11/2013 | Lee et al. |
| 9,480,190 B2 | 10/2016 | Seo |
| 10,418,305 B2 | 9/2019 | Huang et al. |
| 2004/0207075 A1* | 10/2004 | Noguchi ............ H01L 23/3735 257/E23.101 |
| 2006/0267164 A1 | 11/2006 | Chung et al. |
| 2008/0023822 A1 | 1/2008 | Lee et al. |

(Continued)

FOREIGN PATENT DOCUMENTS

| | | |
|---|---|---|
| JP | 2010206072 A | 9/2010 |
| JP | 5184115 B2 | 4/2013 |

(Continued)

*Primary Examiner* — Benjamin Tzu-Hung Liu
(74) *Attorney, Agent, or Firm* — Muir Patent Law, PLLC

(57) ABSTRACT

Disclosed is a semiconductor package including a base film that has a first surface and a second surface opposite to the first surface, a plurality of input/output lines on the first surface of the base film, a semiconductor chip disposed on the first surface of the base film and connected to the input/output lines and including a central portion and end portions on opposite sides of the central portion, and a heat radiation pattern on the second surface of the base film. The heat radiation pattern corresponds to the semiconductor chip and has a plurality of openings that correspond to the end portions of the semiconductor chip and that vertically overlap the end portions of the semiconductor chip.

20 Claims, 16 Drawing Sheets

(56) References Cited

U.S. PATENT DOCUMENTS

| | | | | |
|---|---|---|---|---|
| 2008/0079146 A1* | 4/2008 | Hattori | ............... | H05K 1/0206 |
| | | | | 257/E23.102 |
| 2009/0008801 A1* | 1/2009 | Lai | ...................... | H01L 24/17 |
| | | | | 257/E23.141 |
| 2009/0195997 A1 | 8/2009 | Ishimaru et al. | | |
| 2009/0273076 A1* | 11/2009 | Choi | ................. | H05K 1/0203 |
| | | | | 257/E23.101 |
| 2010/0002399 A1* | 1/2010 | Mori | ................. | H01L 23/367 |
| | | | | 361/719 |

FOREIGN PATENT DOCUMENTS

| | | | |
|---|---|---|---|
| KR | 100618898 B1 | | 9/2006 |
| KR | 100771890 B1 | | 11/2007 |
| KR | 100785950 B1 | | 12/2007 |
| KR | 101493869 | * | 2/2015 |
| KR | 101493869 B1 | | 2/2015 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0086278 filed on Jul. 13, 2020 in the Korean Intellectual Property Office, the disclosure of which is hereby incorporated by reference in its entirety.

BACKGROUND

The present inventive concepts relate to a semiconductor package, and more particularly, to a semiconductor package in which a semiconductor chip is attached onto a film.

A chip-on-film (COF) package technique has been developed to use a flexible film substrate in order to cope with recent trend toward smaller, thinner, and lighter electronic products. According to the COF package technique, a semiconductor chip may be directly flip-chip bonded to a film substrate and coupled through a short lead to an external circuit. The COF package may be applied to portable terminal devices such as a cellular phone and a personal digital assistant (PDA), laptop computers, or display panels.

SUMMARY

Some example embodiments of the present inventive concepts provide a semiconductor package with increased reliability.

An object of the present inventive concepts is not limited to the benefits mentioned herein, and other objects which are not mentioned herein will be clearly understood to those skilled in the art from the following description.

According to some example embodiments of the present inventive concepts, a semiconductor package may include: a base film that has a first surface and a second surface opposite to the first surface; a plurality of input/output lines on the first surface of the base film; a semiconductor chip on the first surface of the base film and connected to the input/output lines, the semiconductor chip including a central portion and end portions on opposite sides of the central portion; and a heat radiation pattern on the second surface of the base film, the heat radiation pattern corresponding to the semiconductor chip and having a plurality of openings that correspond to the end portions of the semiconductor chip and that vertically overlap the end portions of the semiconductor chip.

According to some example embodiments of the present inventive concepts, a semiconductor package may include: a base film that has a first surface and a second surface opposite to the first surface; a semiconductor chip on the first surface of the base film, the semiconductor chip having a length in a first direction and a width in a second direction perpendicular to the first direction, the width being less than the length; and a heat radiation pattern on the second surface of the base film. The semiconductor chip may include: a plurality of first chip pads adjacent to a first edge of the semiconductor chip parallel to the second direction; and a plurality of second chip pads adjacent to a second edge of the semiconductor chip opposite to the first edge. The heat radiation pattern may have a first opening that vertically overlaps the first chip pads of the semiconductor chip and a second opening that vertically overlaps the second chip pads of the semiconductor chip. Each of the first and second openings may have an opening length in the second direction. The opening length may be greater than the width of the semiconductor chip.

According to some example embodiments of the present inventive concepts, a semiconductor package may include: a base film that has a first surface and a second surface opposite to the first surface; a plurality of input/output lines on the first surface of the base film; a semiconductor chip on the first surface of the base film and connected to the input/output lines, the semiconductor chip including: first and second edges opposite to each other; third and fourth edges perpendicular to the first and second edges and opposite to each other, the first and second edges being longer than the third and fourth edges; and a heat radiation sheet on the second surface of the base film, the heat radiation sheet corresponding to the semiconductor chip. The semiconductor chip may include a plurality of first chip pads arranged adjacent to the first and second edges and a plurality of second chip pads arranged adjacent to the third and fourth edges. The heat radiation sheet may have first and second openings that partially expose the base film. The first opening may vertically overlap the second chip pads adjacent to the third edge. The second opening may vertically overlap the second chip pads adjacent to the fourth edge.

Details of other example embodiments are included in the description and drawings.

DETAILED DESCRIPTION OF EMBODIMENTS

A semiconductor package according to some example embodiments of the present inventive concepts will be discussed in conjunction with the accompanying drawings.

Figure 1:
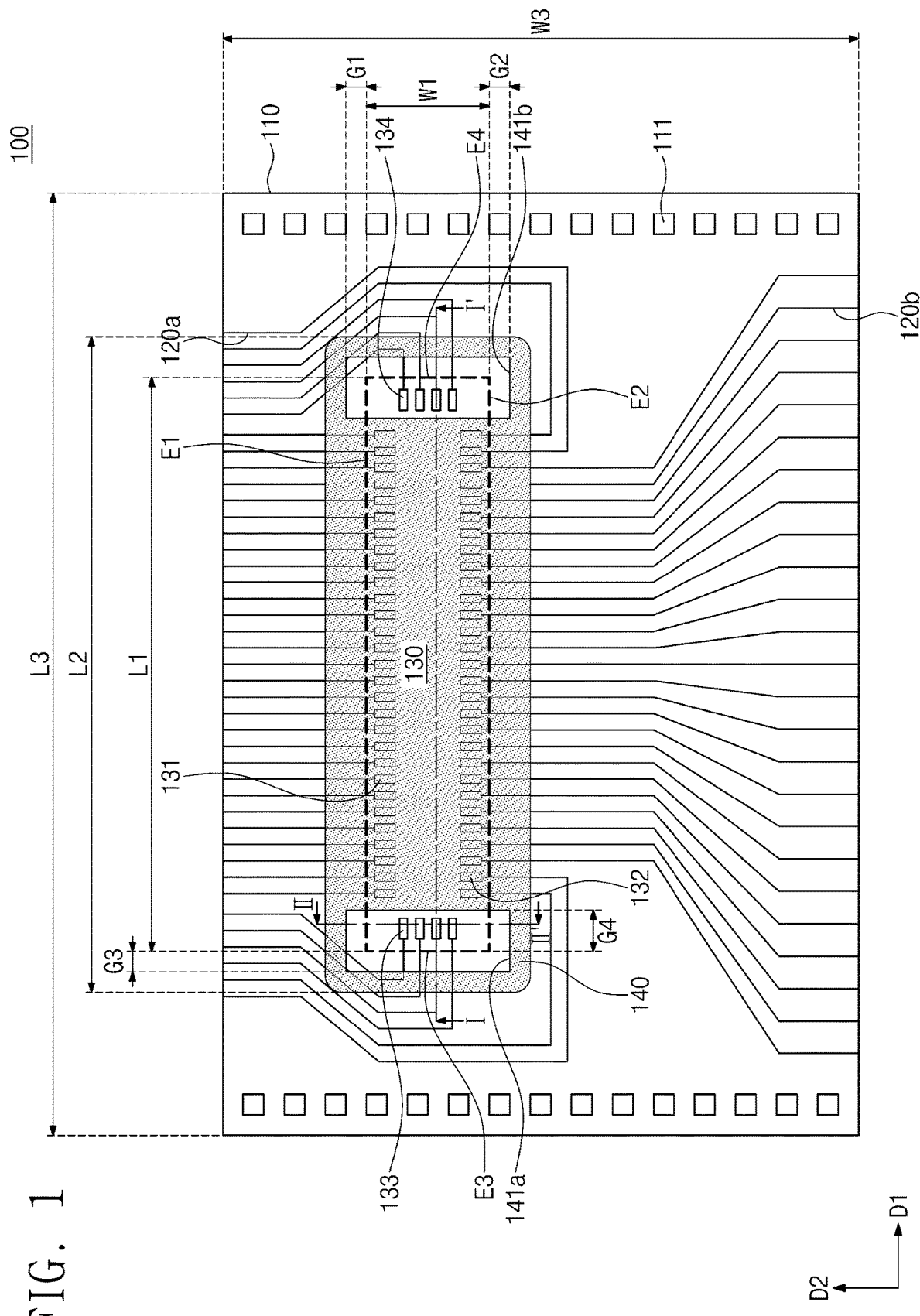
FIG. 1 illustrates a plan view showing a semiconductor package according to some example embodiments of the present inventive concepts.
Figure 2A:
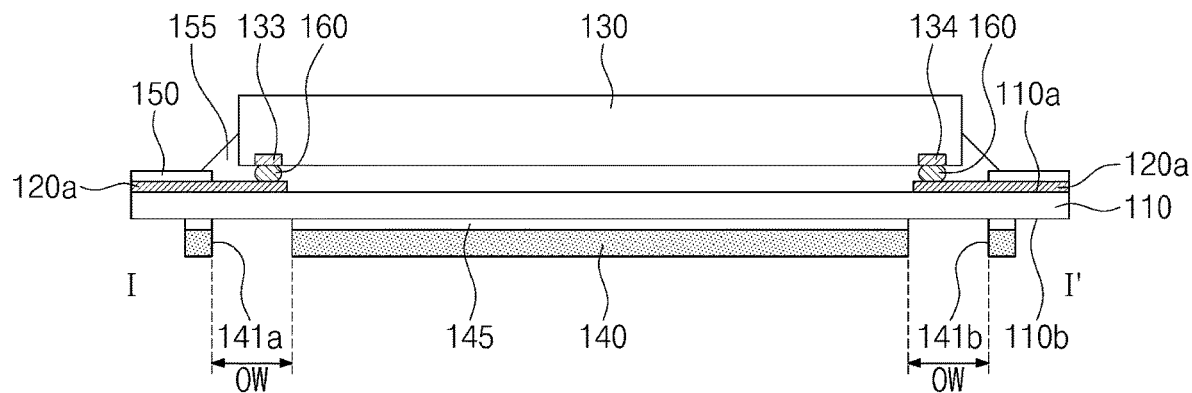
FIG. 2A illustrates a cross-sectional view taken along line I-I' of FIG. 1, showing a semiconductor package according to some example embodiments of the present inventive concepts.
Figure 2B:
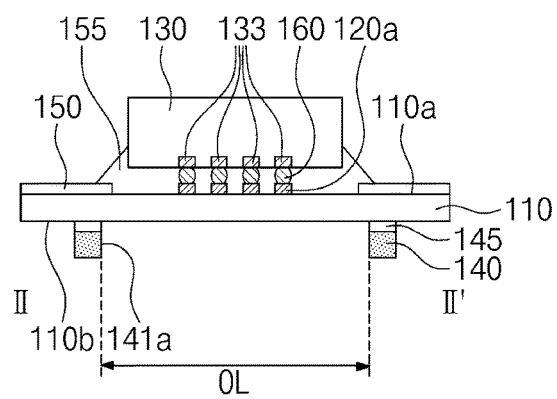
FIG. 2B illustrates a cross-sectional view taken along line II-II' of FIG. 1, showing a semiconductor package according to some example embodiments of the present inventive concepts.
Figure 3:
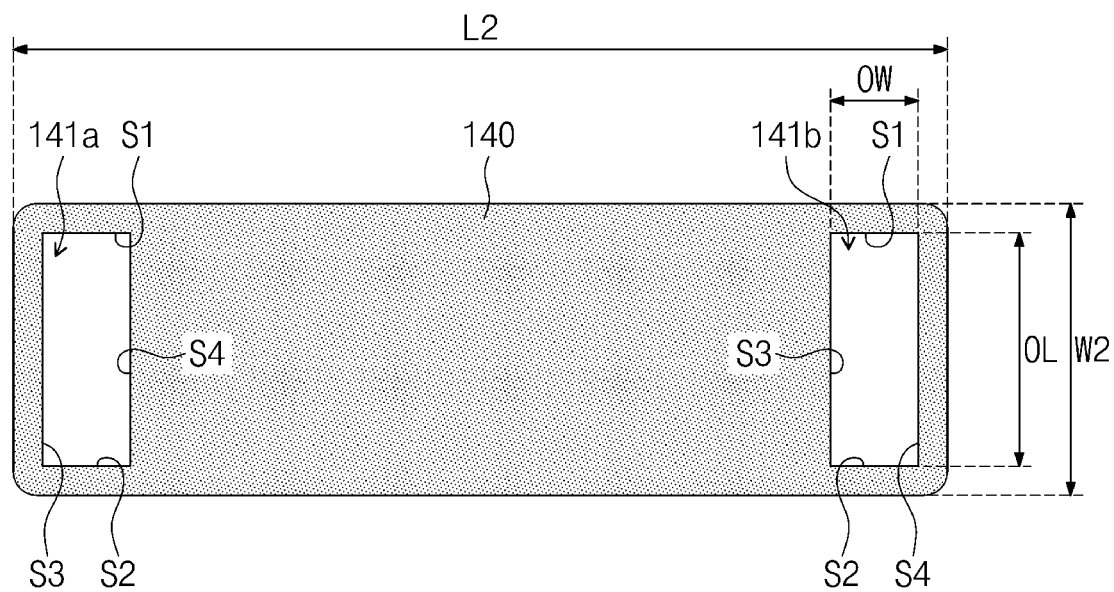
FIG. 3 illustrates a plan view showing a heat radiation pattern of a semiconductor package according to some example embodiments of the present inventive concepts.
Figure 3:
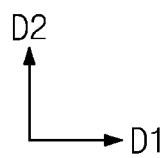

FIG. 1 illustrates a plan view showing a semiconductor package according to some example embodiments of the present inventive concepts. FIG. 2A illustrates a cross-sectional view taken along line I-I' of FIG. 1, showing a semiconductor package according to some example embodiments of the present inventive concepts. FIG. 2B illustrates a cross-sectional view taken along line II-II' of FIG. 1, showing a semiconductor package according to some example embodiments of the present inventive concepts. FIG. 3 illustrates a plan view showing a heat radiation pattern of a semiconductor package according to some example embodiments of the present inventive concepts.

Referring to FIGS. 1, 2A, and 2B, a semiconductor package 100 may include a base film 110, input/output lines 120a and 120b, a semiconductor chip 130, connection terminals 160, and a heat radiation pattern 140.

The base film 110 may be a flexible film including or formed of an electrically insulative material such as polyimide with excellent durability and low coefficient of thermal expansion (CTE). Alternatively, the base film 110 may include an epoxy resin, an acrylic resin, a polyether nitrile resin, a polyether sulfone resin, a polyethylene terephthalate resin, a polyethylene naphthalate resin, or any suitable synthetic resin.

The base film 110 may include guide holes 111 that are spaced apart from each other at a regular interval on opposite edges of the base film 110. The guide holes 111 may allow a winding reel (not shown) to reel the base film 110 thereon or to release the base film 110 therefrom.

The base film 110 may have a first surface 110a and a second surface 110b opposite to the first surface 110a. The input/output lines 120a and 120b may be disposed on the first surface 110a of the base film 110. The input/output lines 120a and 120b may include, for example, aluminum or copper. The input/output lines 120a and 120b may be formed by using casting, laminating, or electroplating, for example. The input/output lines 120a and 120b may be disposed either only on the first surface 110a of the base film 110, or on both on the first and second surfaces 110a and 110b of the base film 110. When the input/output lines 120a and 120b are disposed on both the first and second surfaces 110a and 110b of the base film 110, one or more conductive vias (not shown) may be formed to penetrate the base film 110.

In one embodiment, the input/output lines 120a are all input lines (which may be described specifically as input lines 120a), and the input/output lines 120b are all output lines (which may be described specifically as output lines 120b). In relation to the semiconductor chip 130, the input lines 120a may extend in a direction opposite to an extending direction of the output lines 120b. For example, the input lines 120a may extend toward a first side or edge of the semiconductor chip 130, and the output lines 120b may extend toward a second side or edge of the semiconductor chip 130, opposite to the first side or edge. The input lines 120a may be connected to a printed circuit board, and the output lines 120b may be connected to a display panel. The input lines 120a may provide the semiconductor chip 130 with signal voltages transferred from the printed circuit board, and the output lines 120b may provide the display panel with image signals generated in the semiconductor chip 130.

The semiconductor chip 130 may be mounted on the first surface 110a of the base film 110. The semiconductor chip 130 may have a rectangular shape with a major axis and a minor axis. For example, the semiconductor chip 130 may include first and second edges E1 and E2 that are opposite to each other and parallel to the major axis, and may also include third and fourth edges E3 and E4 that are opposite to each other and perpendicular to the first and second edges E1 and E2. The third and fourth edges E3 and E4 may be parallel to the minor axis.

The semiconductor chip 130 may have a first length L1 in a first direction D1 (or major-axis direction) and a first width W1 in a second direction D2 (or minor-axis direction) perpendicular to the first direction D1. The first width W1 may be less than the first length L1. For example, the semiconductor chip 130 may be configured such that the first length L1 in the first direction D1 (or major-axis direction) may be about 5 to 15 times the first width W1 in the second direction D2 (or minor-axis direction), though in some embodiments, the first length L1 may be greater than 15 times the first width W1. For example, the first length L1 of the semiconductor chip 130 may have a value in a range from about 15,000 μm to about 17,000 μm in the first direction D1, and the first width W1 of the semiconductor chip 130 may have a value in a range from about 900 μm to about 1,500 μm in the second direction D2. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The semiconductor chip 130 may include an integrated circuit formed on a wafer, and may include chip pads disposed on a bottom surface thereof. The chip pads of the semiconductor chip 130 may include first chip pads 131 adjacent to the first edge E1, second chip pads 132 adjacent to the second edge E2, third chip pads 133 adjacent to the third edge E3, and fourth chip pads 134 adjacent to the fourth edge E4. The first chip pads 131 may be arranged symmetrically with the second chip pads 132 with respect to a line extending in the first direction D1 along a center of the semiconductor chip 130 in the second direction D2, and the third chip pads 133 may be arranged symmetrically with the fourth chip pads 134 with respect to a line extending in the second direction D2 along a center of the semiconductor chip 130 in the first direction D1.

The semiconductor chip 130 may include a central portion and opposite end portions on opposing sides of the central portion. The first and second chip pads 131 and 132 may be disposed on the central portion of the semiconductor chip 130, and the third and fourth chip pads 133 and 134 may be disposed on the opposite end portions of the semiconductor chip 130. For example, in the first direction D1, the first and second chip pads 131 and 132 may be disposed in an inner portion of the semiconductor chip 130, and in the same first direction D1, the third and fourth chip pads 133 and 134 may be disposed on opposite ends, on an outer portion of the semiconductor chip 130. The first chip pads 131 may include a plurality of chip pads (e.g., 3 or more) aligned in a row extending in the first direction D1, and the second chip pads 132 may also include a plurality of chip pads (e.g., 3 or more) aligned in a row extending in the first direction D1. The third chip pads 133 may include a plurality of chip pads (e.g., 3 or more) aligned in a row extending in the second direction D2, and the fourth chip pads 134 may also include a plurality of chip pads (e.g., 3 or more) aligned in a row extending in the second direction D2. Each row of chip pads extending in the first direction D1 may include more chip pads than each row of chip pads extending in the second direction D2 (e.g., between about two times as many chip pads to about eight times as many chip pads). The first, second, third, and fourth chip pads 131, 132, 133 and 134 of the semiconductor chip 130 may be connected through the connection terminals 160 to corresponding input/output lines 120*a* and 120*b*. For example, the semiconductor chip 130 may be flip-chip mounted on the base film 110. The first, second, third, and fourth chip pads 131, 132, 133 and 134 of the semiconductor chip 130 may be physically coupled through the connection terminals 160 to the input/output lines 120*a* and 120*b*. For example, the connection terminals 160 may be conductive bumps or solder balls. The connection terminals 160 may be described as chip-external connection terminals, since they are disposed at an external surface of the semiconductor chip 130 and transmit signals and/or voltage from outside of the semiconductor chip 130 to the semiconductor chip 130, or from the semiconductor chip 130 to outside the semiconductor chip 130.

According to some example embodiments, the semiconductor chip 130 may be a display driver integrated chip (IC) that drives the display panel. For example, the semiconductor chip 130 may generate image signals by using data signals transferred from a timing controller, and may output the image signals to the display panel. For another example, the semiconductor chip 130 may be a timing controller connected to a display driver IC.

For another example, when the semiconductor package 100 is combined with an electronic device other than the display device, the semiconductor chip 130 may be used to drive the electronic device.

A passivation layer 150 may be disposed on the first surface 110*a* of the base film 110. The passivation layer 150 may cover the input/output lines 120*a* and 120*b*. The passivation layer 150 may include, for example, a solder resist or a dry film resist, or alternatively may be an oxide-based or nitride-based dielectric layer.

An under-fill layer 155 may be disposed along a bottom edge of the semiconductor chip 130, and may fill a space between the base film 110 and the semiconductor chip 130. The under-fill layer 155 may partially cover the input/output lines 120*a* and 120*b*. The under-fill layer 155 may include, for example, an epoxy resin.

The heat radiation pattern 140 may be disposed on the second surface 110*b* of the base film 110, and an adhesive layer 145 may be provided between the heat radiation pattern 140 and the second surface 110*b* of the base film 110. The adhesive layer 145 may be, for example, a polymer tape including a dielectric material, and thus may be electrically insulative.

The heat radiation pattern 140 may externally discharge heat that is generated when the semiconductor chip 130 operates. The heat radiation pattern 140 may be formed of a material whose thermal expansion coefficient is greater than that of the base film 110. For example, the heat radiation pattern 140 may be a metal tape of, for example, copper (Cu), aluminum (Al), or an alloy thereof. The heat radiation pattern 140 may also be described as a heat radiation sheet, heat radiation film, heat radiation foil, or heat radiation material layer.

According to some example embodiments, the heat radiation pattern 140 may have a first opening 141*a* that corresponds to a first end portion of the semiconductor chip 130 and a second opening 141*b* that corresponds to a second end portion of the semiconductor chip 130 opposite the first end portion. The heat radiation pattern 140 may include a central portion between the first and second openings 141*a* and 141*b*. In some example embodiments, the first opening 141*a* and the second opening 141*b* may have substantially the same size and may be disposed symmetrically with each other about a line extending in the second direction D2 and passing through a center of the heat radiation pattern 140 in the first direction D1. The heat radiation pattern 140 may be configured such that the central portion between the first and second openings 141*a* and 141*b* may overlap the first chip pads 131 and the second chip pads 132 of the semiconductor chip 130. As can be seen in FIG. 1 and in other example figures showing embodiments of a heat radiation pattern, heat radiation pattern 140 includes a central portion that is continuous and covers an entire area of the semiconductor chip 130 on the central portion, and includes outer portion integrally connected to and formed with the central portion but outside of an area of the semiconductor chip 130. Part of the semiconductor chip 130 outside of the central portion of the heat radiation pattern 140 is not covered by the heat radiation pattern 140.

For example, referring to FIGS. 1 and 3, a size of the heat radiation pattern 140 may depend on a size of the semiconductor chip 130. The heat radiation pattern 140 may have a rectangular shape with a major axis and a minor axis. The heat radiation pattern 140 may have a second length L2 in the first direction D1 (or major-axis direction) greater than the first length L1 of the semiconductor chip 130, and may also have a second width W2 in the second direction D2 (or minor-axis direction) greater than the first width W1 of the semiconductor chip 130. The second length L2 of the heat radiation pattern 140 may be less than a length L3 in the first direction D1 of the base film 110, and the second width W2 of the heat radiation pattern 140 may be less than a width W3 in the second direction D2 of the base film 110. The heat radiation pattern 140 may have a thickness less than that of the semiconductor chip 130, and the heat radiation pattern 140 may have a thickness in the range from about 15 μm to about 50 μm.

Each of the first and second openings 141*a* and 141*b* of the heat radiation pattern 140 may have an opening width OW in the first direction D1 and an opening length OL in the second direction D2. The opening width OW may be less than the opening length OL. The opening length OL may be greater than the first width W1 of the semiconductor chip 130 and less than the second width W2 of the heat radiation pattern 140. For example, the opening width OW may be in a range from about 600 μm to about 4,600 μm. The opening length OL may be in a range from about 1,200 μm to about 9,000 μm.

Each of the first and second openings 141*a* and 141*b* of the heat radiation pattern 140 may have a first side S1 spaced apart from the first edge E1 of the semiconductor chip 130, a second side S2 spaced apart from the second edge E2 of the semiconductor chip 130, and third and fourth sides S3 and S4 that are opposite to each other and spaced apart from the third edge E3 or the fourth edge E4 of the semiconductor chip 130.

Each of the first and second openings 141*a* and 141*b* may be configured such that the first side S1 is spaced apart at a first distance G1 from the first edge E1 of the semiconductor chip 130, and that the second side S2 is spaced apart at a second distance G2 from the second edge E2 of the semiconductor chip 130. For example, the first distance G1 may be substantially the same as the second distance G2. The first distance G1 and the second distance G2 may be in a range from about 1.0 μm to about 2.5 μm. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The third side S3 of the first opening 141a may be spaced apart at a third distance G3 from the third edge E3 of the semiconductor chip 130, and the fourth side S4 of the first opening 141a may be spaced apart at a fourth distance G4 from the third edge E3 of the semiconductor chip 130. The third distance G3 may be substantially the same as or less than the fourth distance G4. The third distance G3 and the fourth distance G4 may each be in a range from about 1.0 μm to about 2.5 μm.

The third and fourth sides S3 and S4 of the second opening 141b may be spaced apart from the fourth edge E4 of the semiconductor chip 130. For example, about 1.0 μm to about 2.5 μm may be given as a distance between the fourth side S4 of the second opening 141b and the fourth edge E4 of the semiconductor chip 130.

The first opening 141a of the heat radiation pattern 140 may partially expose the second surface 110b of the base film 110, and may overlap the third chip pads 133 disposed on the third edge E3 of the semiconductor chip 130. The second opening 141b of the heat radiation pattern 140 may partially expose the second surface 110b of the base film 110, and may vertically overlap the fourth chip pads 134 disposed adjacent to the fourth edge E4 of the semiconductor chip 130.

For example, the heat radiation pattern 140 may have its openings that overlap connection sections where the input/output lines 120a and 120b are coupled to the connection terminals 160, which connection sections are disposed adjacent to the third and fourth edges E3 and E4 of the semiconductor chip 130. In such cases, the heat radiation pattern 140 may be absent below the opposite end portions of the semiconductor chip 130 that have the third and fourth chip pads 133 and 134 disposed thereon.

Because the heat radiation pattern 140 has no parts that overlap the opposite end portions of the semiconductor chip 130, the connection sections between the connection terminals 160 and the input/output lines 120a and 120b may be prevented from concentration of stress caused by expansion of the heat radiation pattern 140 on the opposite end portions of the semiconductor chip 130. Accordingly, it may be possible to avoid damage to the connection terminals 160 and the input lines 120a and 120b.

For brevity of description in the embodiments that follow, the same components are allocated the same reference numerals as those of FIGS. 1, 2A, 2B and 3, and explanations thereof will be omitted while differences will be described.

Figure 4:
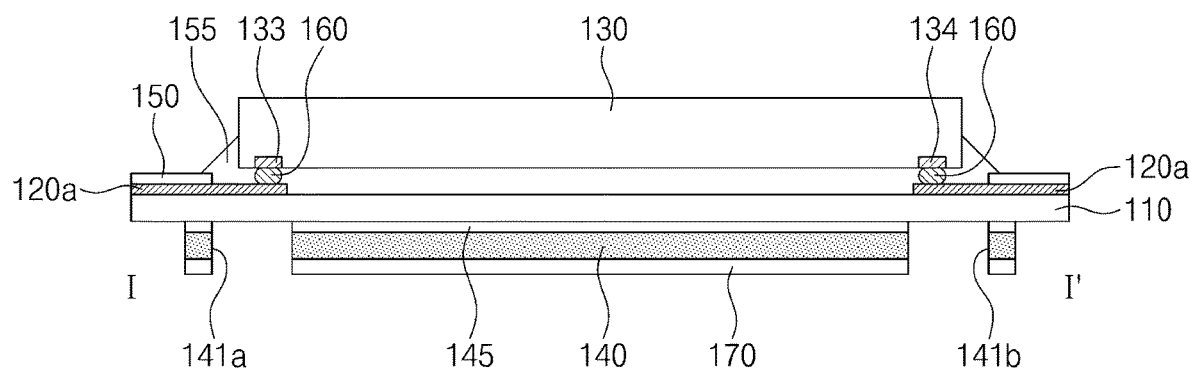
FIGS. 4, 5, and 6 illustrate cross-sectional views taken along line I-I' of FIG. 1, showing a semiconductor package according to some example embodiments of the present inventive concepts.
Figure 5:
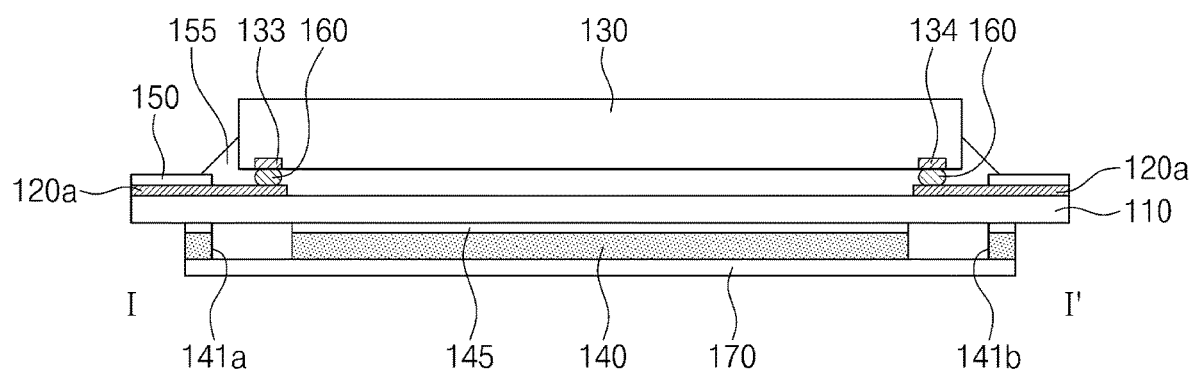
Figure 6:
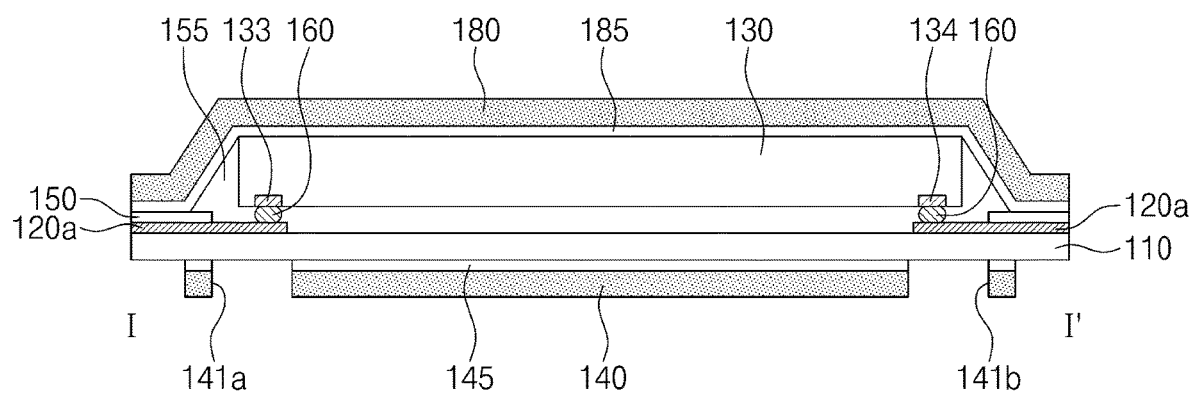

FIGS. 4, 5, and 6 illustrate cross-sectional views taken along line I-I' of FIG. 1, showing a semiconductor package according to some example embodiments of the present inventive concepts.

Referring to FIG. 4, a lower passivation layer 170 may be disposed on a surface of the heat radiation pattern 140. The lower passivation layer 170 may be a polyimide layer. The lower passivation layer 170 may have openings whose positions are substantially the same as those of the first and second openings 141a and 141b of the heat radiation pattern 140.

Referring to FIG. 5, a lower passivation layer 170 may be disposed on a surface of the heat radiation pattern 140, while covering the first and second openings 141a and 141b of the heat radiation pattern 140. The lower passivation layer 170 and the base film 110 may have therebetween empty spaces that correspond to the first and second openings 141a and 141b of the heat radiation pattern 140.

Referring to FIG. 6, the first surface 110a of the base film 110 may be provided thereon with an upper heat radiation pattern 180 that covers the semiconductor chip 130. The upper heat radiation pattern 180 may be attached through an upper adhesive layer 185 to the first surface 110a of the base film 110. The upper heat radiation pattern 180 may have a uniform thickness and may cover a top surface of the semiconductor chip 130 and a top surface of the passivation layer 150. The upper heat radiation pattern 180 may include a metallic material, such as aluminum or copper. The passivation layers described in FIGS. 4-6 may be formed of an insulating material, such as a solder resist or a dry film resist, or alternatively an oxide-based or nitride-based dielectric layer.

Figure 7:
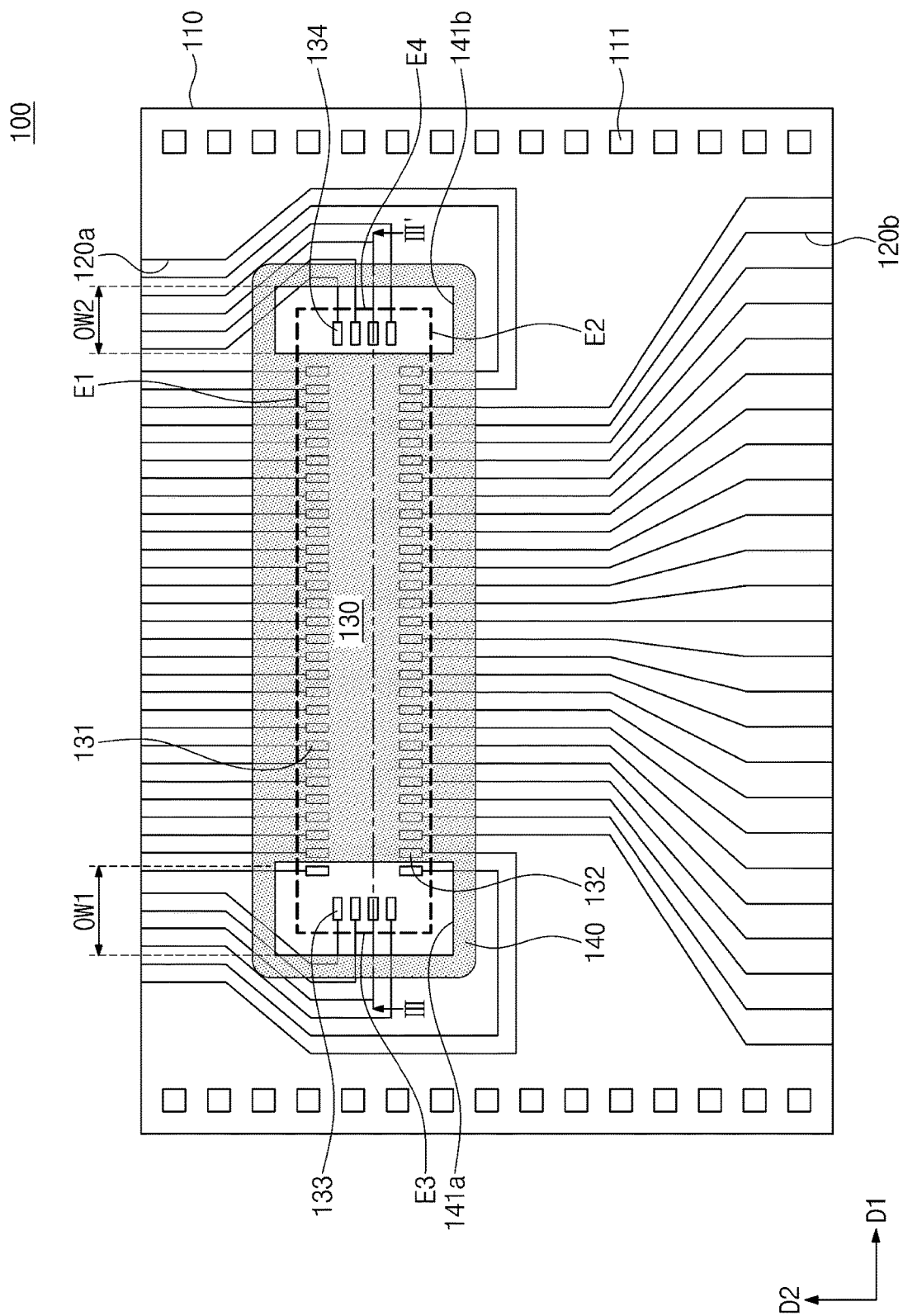
FIG. 7 illustrates a plan view showing a semiconductor package according to some example embodiments of the present inventive concepts.
Figure 8:
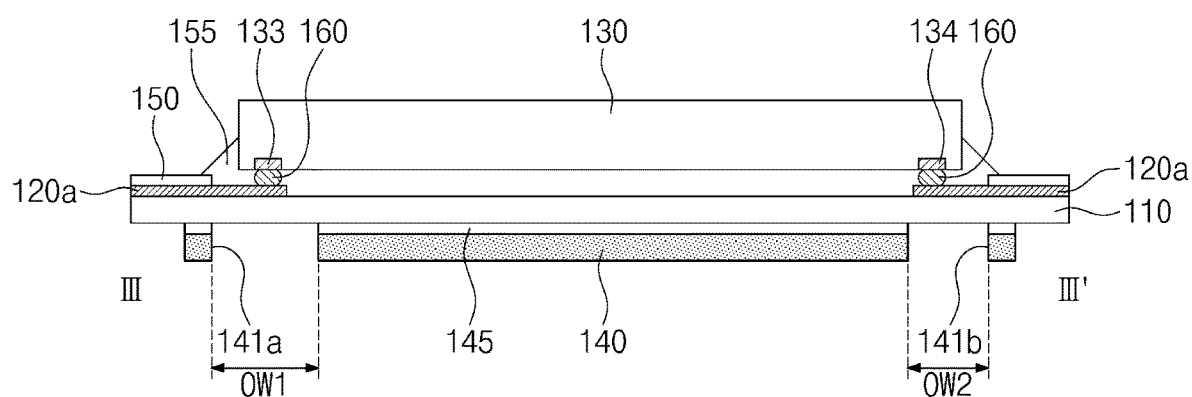
FIG. 8 illustrates a cross-sectional view taken along line III-III' of FIG. 7.

FIG. 7 illustrates a plan view showing a semiconductor package according to some example embodiments of the present inventive concepts. FIG. 8 illustrates a cross-sectional view taken along line III-III' of FIG. 7.

Referring to FIGS. 7 and 8, the heat radiation pattern 140 may have a first opening 141a that corresponds to a first end portion of the semiconductor chip 130 and a second opening 141b that corresponds to a second end portion of the semiconductor chip 130. The heat radiation pattern 140 may include a central portion between the first and second openings 141a and 141b. As discussed above with reference to FIG. 3, each of the first and second openings 141a and 141b may have first, second, third, and fourth sides S1, S2, S3, and S4.

In the present embodiment, the first opening 141a may have a first opening width OW1, and the second opening 141b may have a second opening width OW2. The first opening width OW1 may be different from the second opening width OW2. For example, the first opening width OW1 may be greater than the second opening width OW2, and the first opening 141a may overlap one or more of the first chip pads 131 of the semiconductor chip 130 and one or more of the second chip pads 132 of the semiconductor chip 130. The first and second openings 141a and 141b may have their opening lengths that are substantially the same in the second direction D2. The features of each of FIGS. 7 and 8 may be combined with the features of each of FIG. 4, 5, or 6 as well.

FIGS. 9 to 16 illustrate plan views showing a semiconductor package according to some example embodiments of the present inventive concepts, each of which can be combined with the features of each of FIG. 4, 5, or 6.

Figure 9:
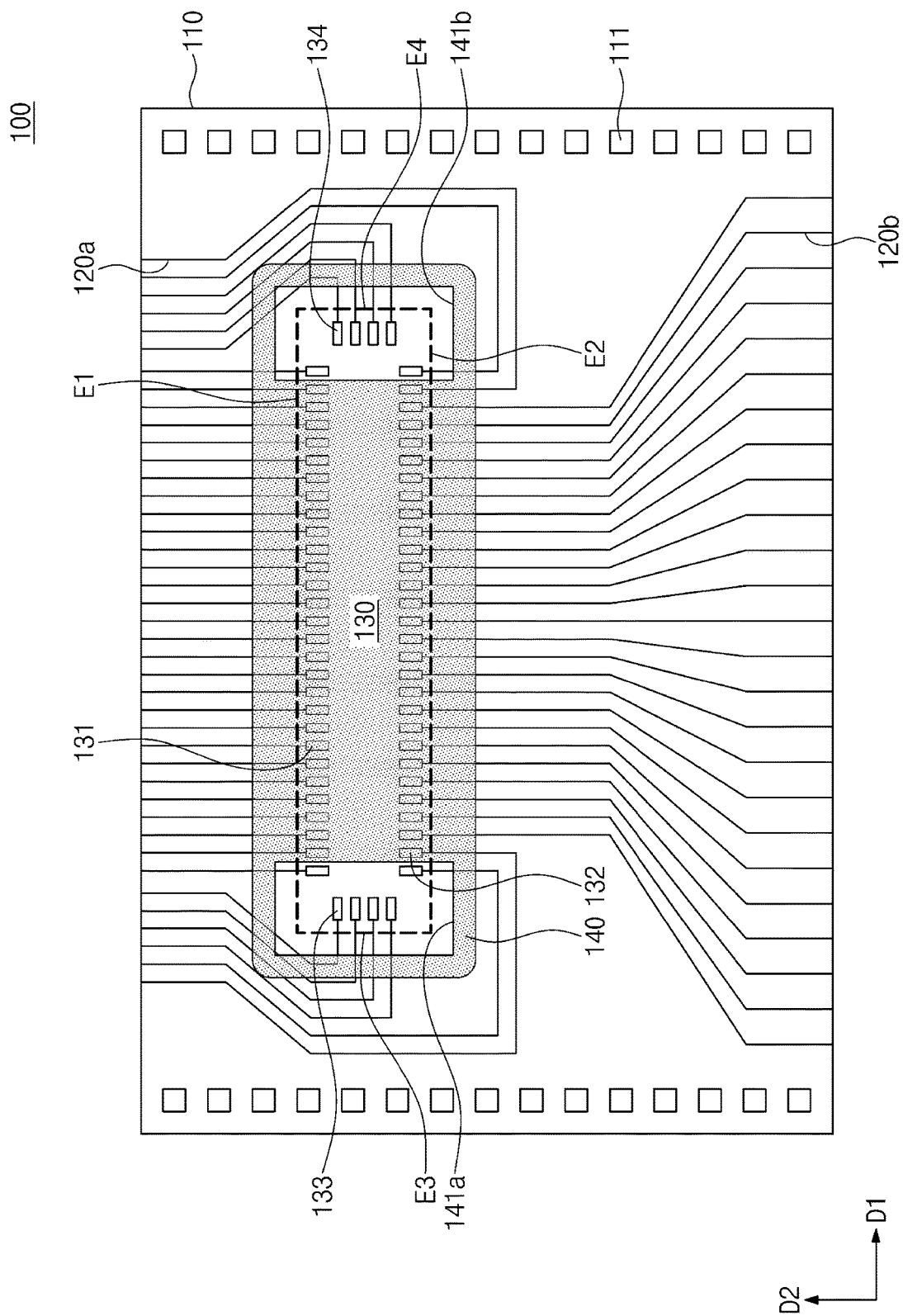
FIGS. 9 to 16 illustrate plan views showing a semiconductor package according to some example embodiments of the present inventive concepts.

Referring to FIG. 9, the heat radiation pattern 140 may have first and second openings 141a and 141b, and as discussed above with reference to FIG. 3, each of the first and second openings 141a and 141b may have first, second, third, and fourth sides S1, S2, S3, and S4. The first, second, third, and fourth sides S1, S2, S3, and S4 of the first and second openings 141a and 141b may be spaced apart from the first, second, third, and fourth edges E1, E2, E3, and E4 of the semiconductor chip 130.

Each of the first and second openings 141a and 141b may overlap one or more of the first chip pads 131 of the semiconductor chip 130 and one or more of the second chip pads 132 of the semiconductor chip 130. A distance between the third edge E3 of the semiconductor chip 130 and the third side S3 of the first opening 141a may be less than a distance between the third edge E3 of the semiconductor chip 130 and the fourth side S4 of the first opening 141a. In addition, a distance between the fourth edge E4 of the semiconductor chip 130 and the fourth side S4 of the second opening 141b may be less than a distance between the fourth edge E4 of the semiconductor chip 130 and the third side S3 of the second opening 141b.

Figure 10:
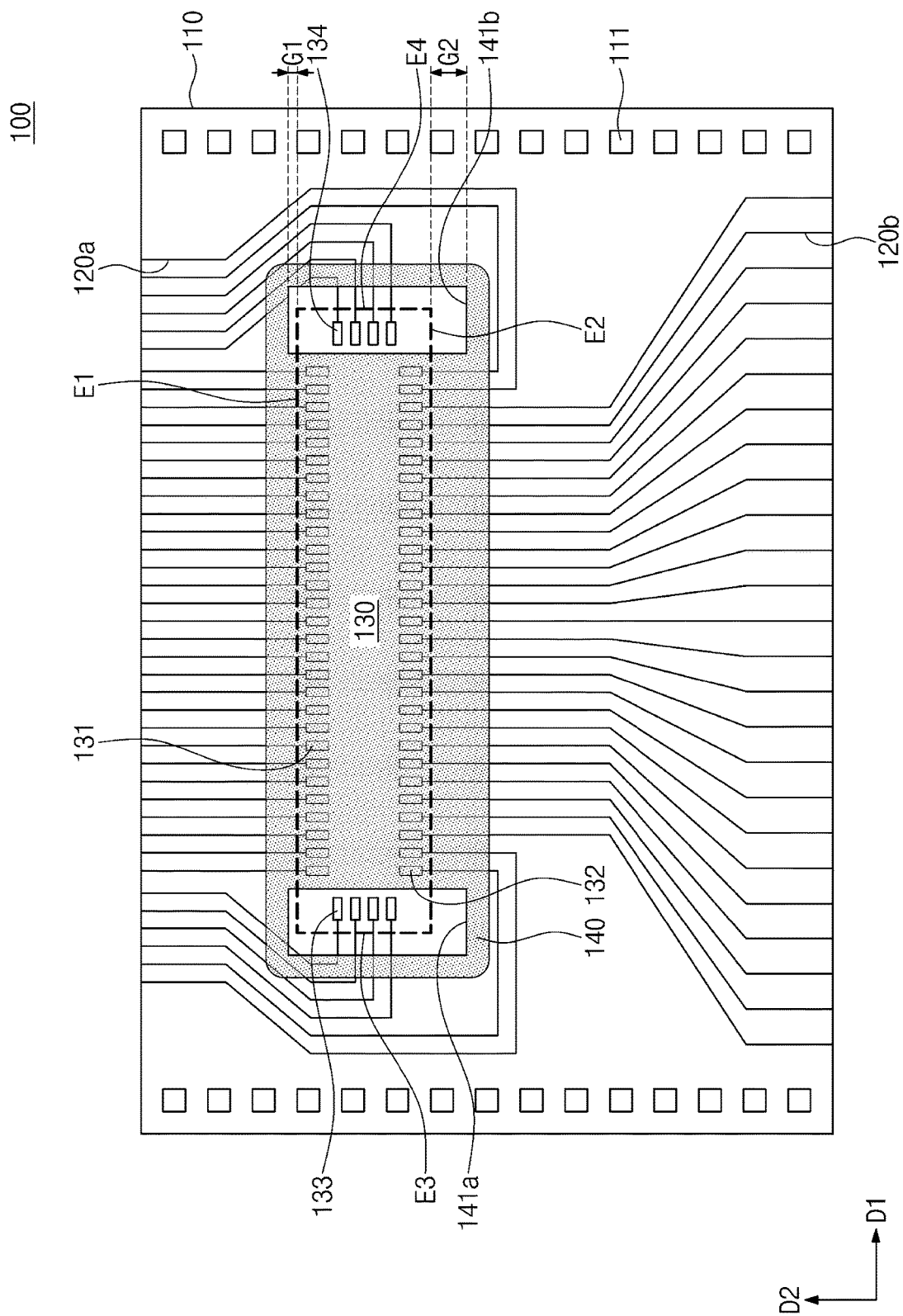

Referring to FIG. 10, each of the first and second openings 141a and 141b may be configured such that the first side S1 may be spaced apart at a first distance G1 from the first edge E1 of the semiconductor chip 130, and the second side S2 may be spaced apart at a second distance G2 from the second edge E2 of the semiconductor chip 130. The first distance G1 may be different from, for example, less than, the second distance G2.

Figure 11:
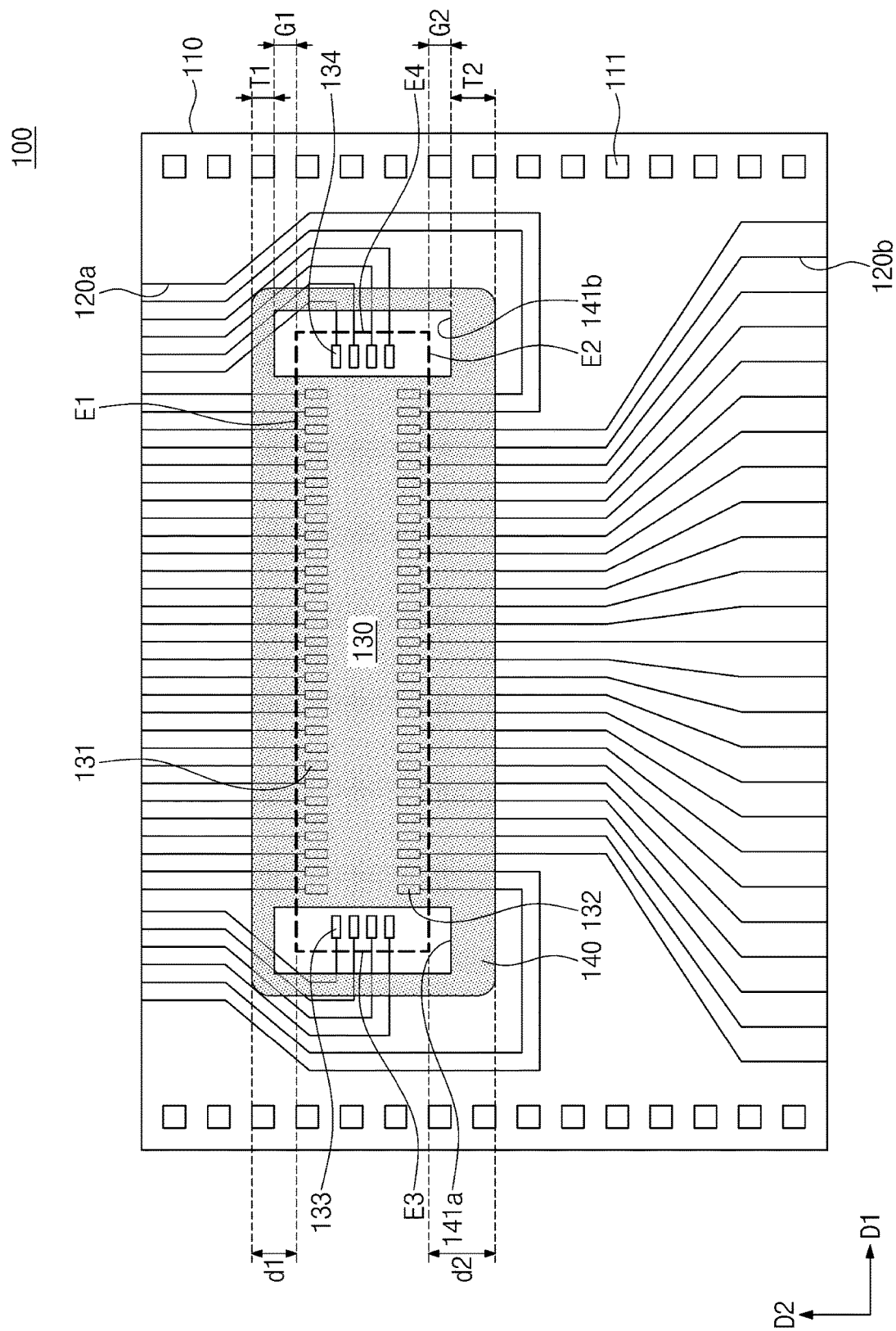

Referring to FIG. 11, the heat radiation pattern 140 may have a substantially rectangular shape, and may have a first edge parallel to the first edge E1 of the semiconductor chip 130 and a second edge parallel to the second edge E2 of the semiconductor chip 130.

A distance d1 between the first edge of the heat radiation pattern 140 and the first edge E1 of the semiconductor chip 130 may be different from a distance d2 between the second edge of the heat radiation pattern 140 and the second edge E2 of the semiconductor chip 130. For example, the distance d1 may be less than the distance d2.

As discussed above, the heat radiation pattern 140 may have first and second openings 141a and 141b, and also have first, second, third, and fourth sides S1, S2, S3, and S4. The first and second openings 141a and 141b may have substantially the same size and may be symmetrical with each other with respect to a line extending midway between them in the second direction D2.

A first distance G1 between the first edge E1 of the semiconductor chip 130 and the first sides S1 of the first and second openings 141a and 141b may be substantially the same as a second distance G2 between the second edge E2 of the semiconductor chip 130 and the second sides S2 of the first and second openings 141a and 141b.

A distance T1 between the first edge of the heat radiation pattern 140 and the first sides S1 of the first and second openings 141a and 141b may be different from a distance T2 between the second edge of the heat radiation pattern 140 and the second sides S2 of the first and second openings 141a and 141b. For example, the distance T1 may be less than the distance T2.

Figure 12:
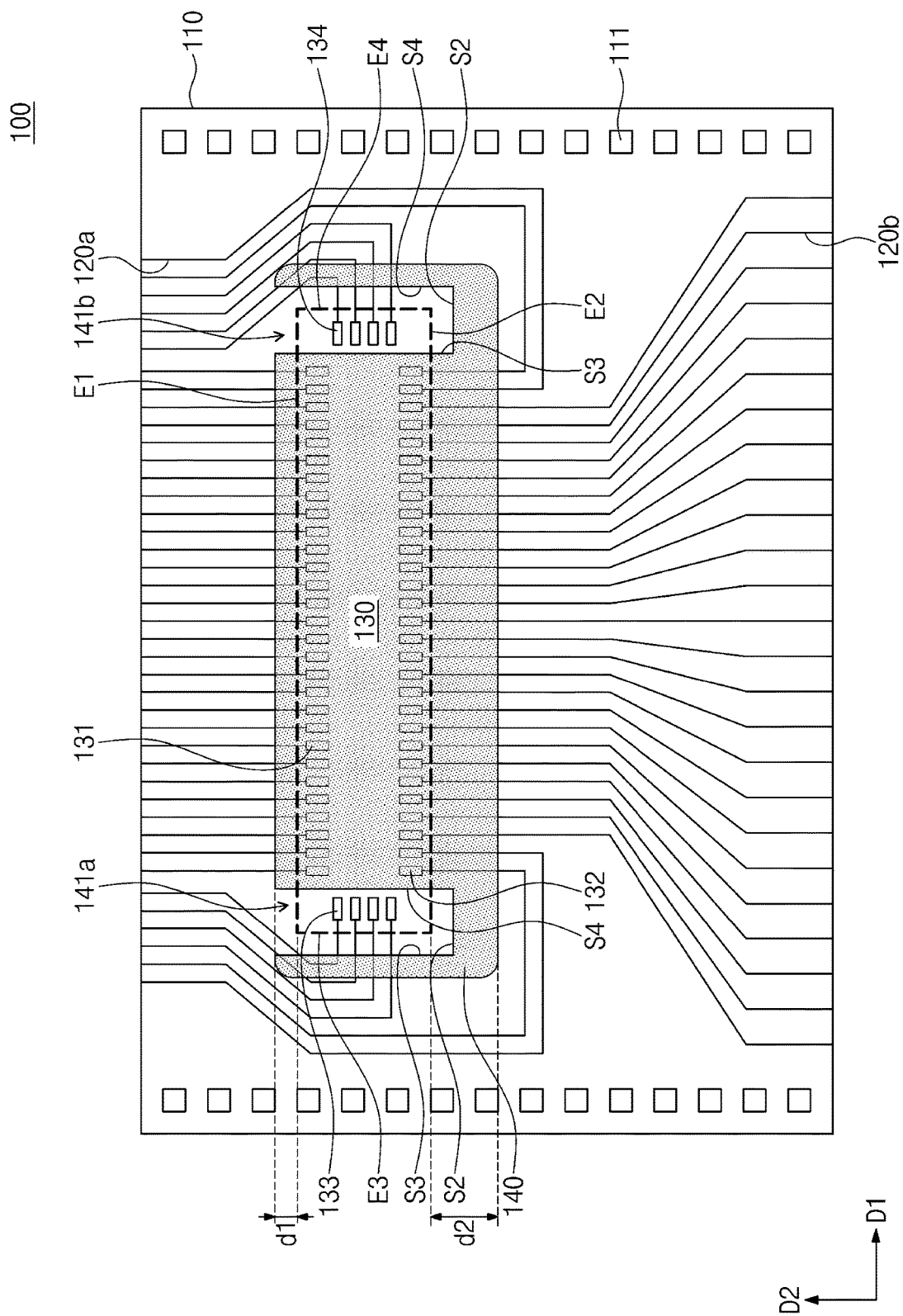

Referring to FIG. 12, a distance d1 between the first edge of the heat radiation pattern 140 and the first edge E1 of the semiconductor chip 130 may be different from a distance d2 between the second edge of the heat radiation pattern 140 and the second edge E2 of the semiconductor chip 130.

The heat radiation pattern 140 may have first and second openings 141a and 141b that are symmetrical with each other, with respect to a line extending in the second direction D2 and located at a center of the heat radiation pattern 140 in the first direction D1, and each of the first and second openings 141a and 141b may be defined by three sides S2, S3, and S4. For example, the first and second openings 141a and 141b may be opened at a section adjacent to the first edge E1 of the semiconductor chip 130. The openings 141a and 141b of FIG. 12 may be described as an opened opening, contrary to the openings in the previously-described embodiments, which may be described as enclosed openings.

Figure 13:
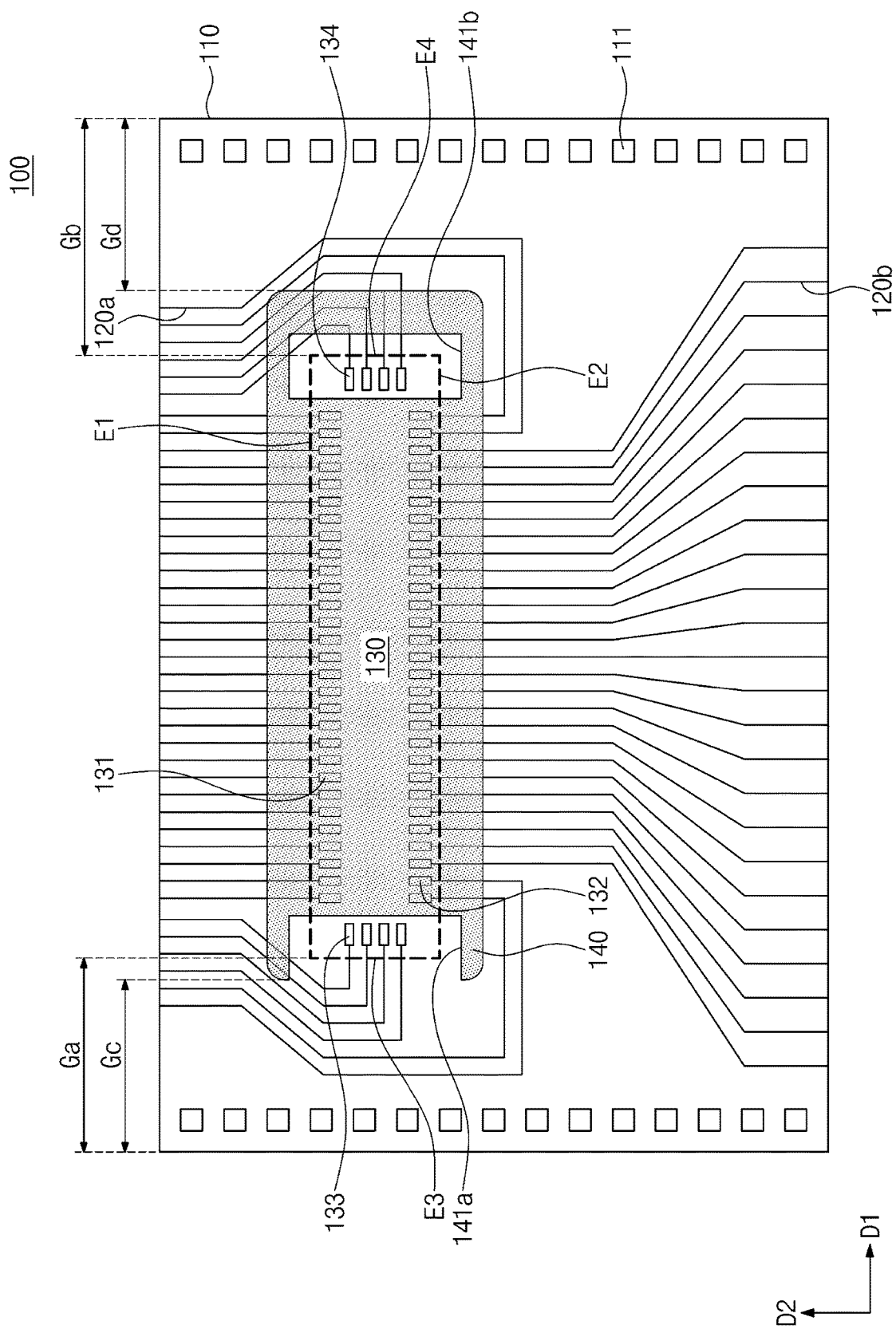

Referring to FIG. 13, a distance Ga between the third edge E3 of the semiconductor chip 130 and one side of the base film 110 may be different from a distance Gb between the fourth edge E4 of the semiconductor chip 130 and another side of the base film 110.

The heat radiation pattern 140 may have a third edge parallel to the third edge E3 of the semiconductor chip 130 and a fourth edge parallel to the fourth edge E4 of the semiconductor chip 130.

A distance Gc between the one side of the base film 110 and the third edge of the heat radiation pattern 140 may be substantially the same as a distance Gd between the other side of the base film 110 and the fourth edge of the heat radiation pattern 140.

The heat radiation pattern 140 may have first and second openings 141a and 141b that are asymmetrical with each other. The first opening 141a of the heat radiation pattern 140 may be defined by three sides, and may therefore be an opened opening, and the second opening 141b of the heat radiation pattern 140 may be defined by fourth sides, and may therefore be an enclosed opening. For example, the first opening 141a of the heat radiation pattern 140 may be defined by the first side (see S1 of FIG. 3) spaced apart from the first edge E1 of the semiconductor chip 130, the second side (see S2 of FIG. 3) spaced apart from the second edge E2 of the semiconductor chip 130, and the fourth side (see S4 of FIG. 3) spaced apart from the third edge E3 of the semiconductor chip 130. As discussed with reference to FIG. 3, the second opening 141b of the heat radiation pattern 140 may be defined by the first, second, third, and fourth sides S1, S2, S3, and S4.

Figure 14:
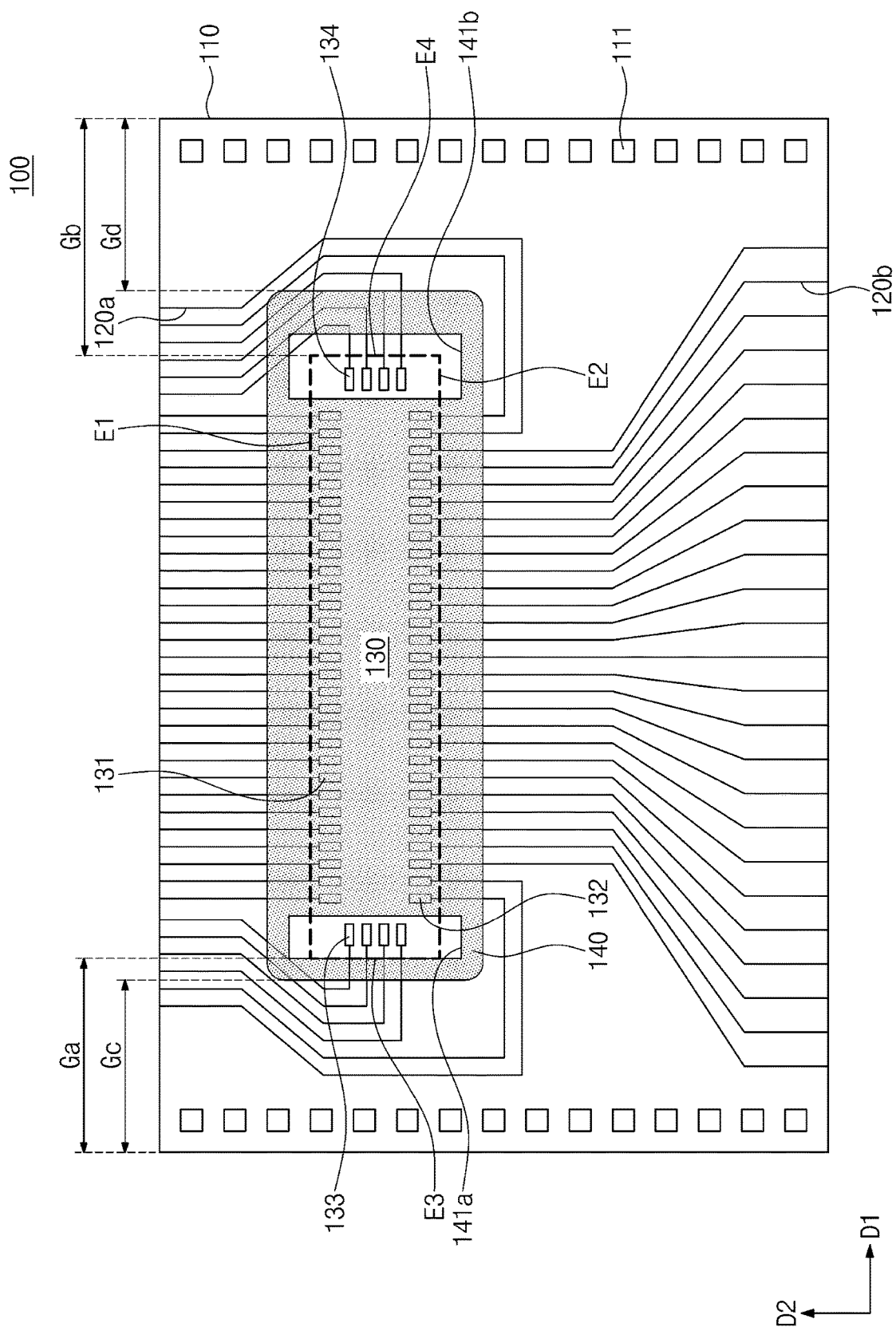

Referring to FIG. 14, a distance Ga between the third edge E3 of the semiconductor chip 130 and one side of the base film 110 may be different from a distance Gb between the fourth edge E4 of the semiconductor chip 130 and another side of the base film 110.

The heat radiation pattern 140 may have a third edge parallel to the third edge E3 of the semiconductor chip 130 and a fourth edge parallel to the fourth edge E4 of the semiconductor chip 130.

A distance Gc between the one side of the base film 110 and the third edge of the heat radiation pattern 140 may be substantially the same as a distance Gd between the other side of the base film 110 and the fourth edge of the heat radiation pattern 140.

The heat radiation pattern 140 may have first and second openings 141a and 141b whose sizes are different from each other. The first and second openings 141a and 141b of the heat radiation pattern 140 may be asymmetrical with each other. For example, the first opening 141a may have a width in the first direction D1 less than a width in the first direction D1 of the second opening 141b. The first opening 141a may overlap the third chip pads 133 of the semiconductor chip 130, and a distance between the third side (see S3 of FIG. 3) of the first opening 141a and the third edge E3 of the semiconductor chip 130 may be less than a distance between the first side (see S1 of FIG. 3) of the first opening 141a and the first edge E1 of the semiconductor chip 130. For example, the third side (see S3 of FIG. 3) of the first opening 141a may be substantially aligned with the third edge E3 of the semiconductor chip 130.

Figure 15:
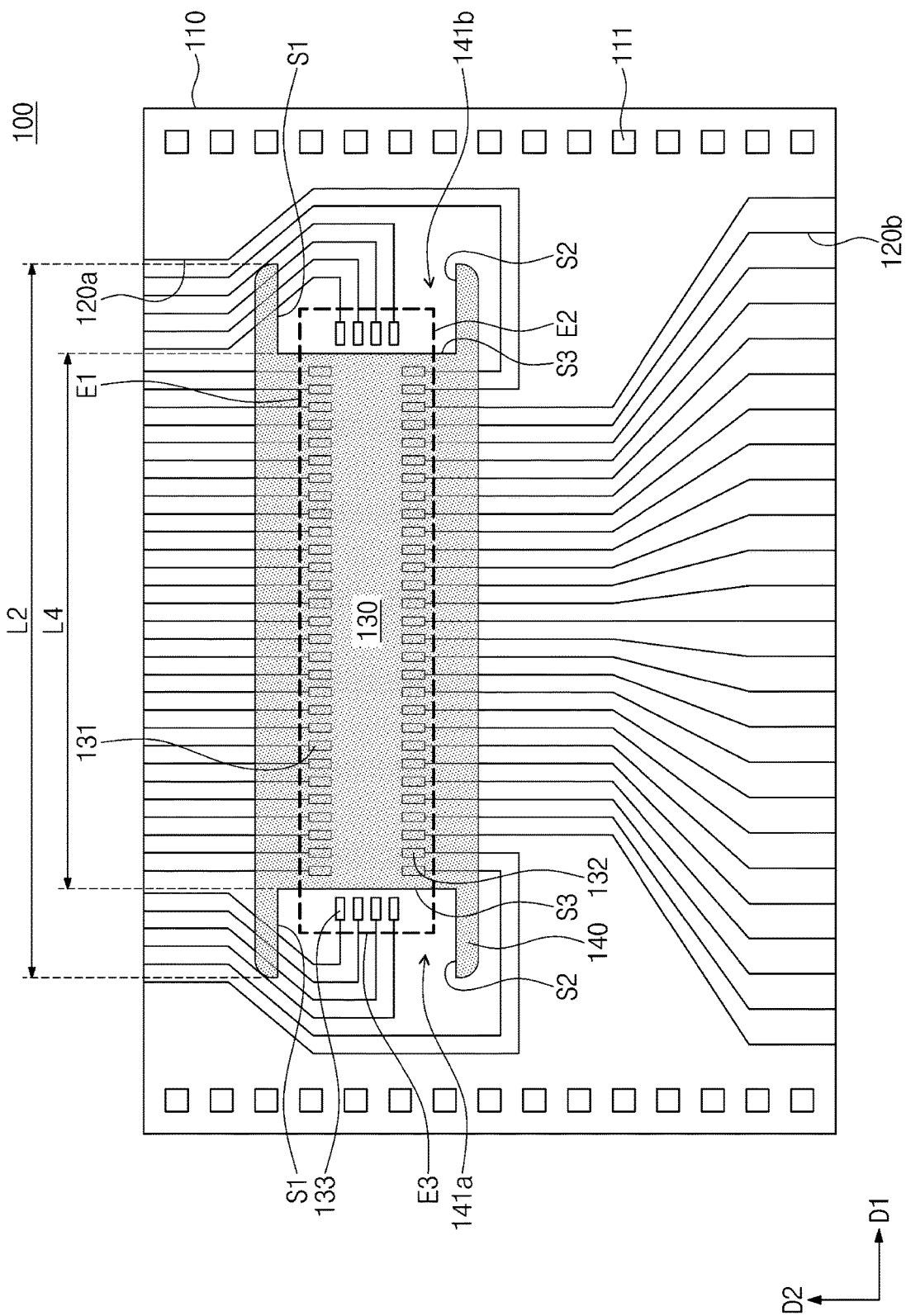
Figure 16:
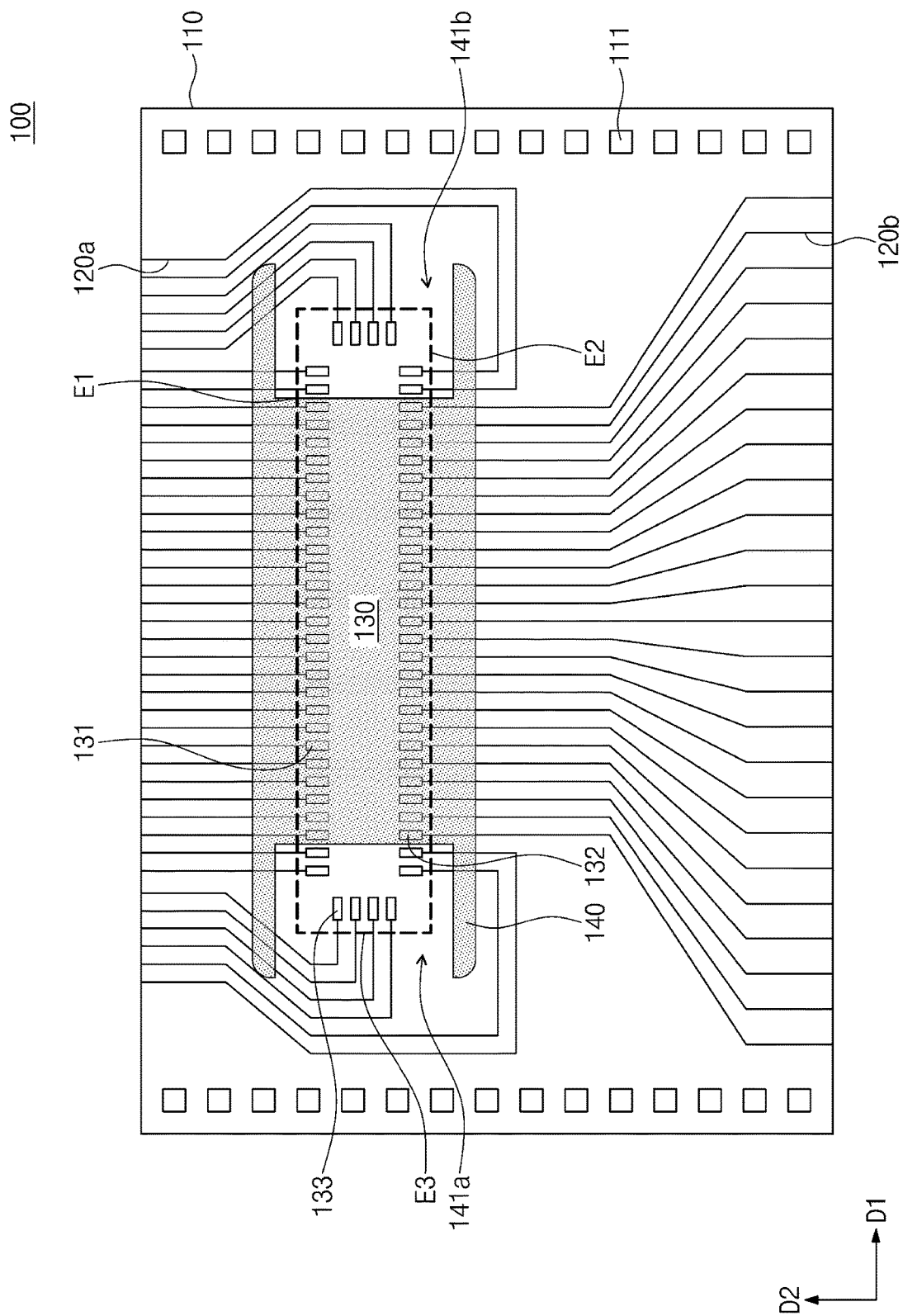

Referring to FIGS. 15 and 16, the heat radiation pattern 140 may include first portions that are parallel to the first direction D1 and spaced apart from each other in the second direction D2, and may also include a second portion between the first portions. When viewed in the first direction D1, the first portions may have a second length L2 greater than the first length L1 of the semiconductor chip 130, and the second portion may have a fourth length L4 less than the second length L2. The second portion of the heat radiation pattern 140 may overlap the central portion of the semiconductor chip 130. When viewed in the second direction D2, the heat radiation pattern 140 may have a width greater than that of the semiconductor chip 130.

As discussed above, the heat radiation pattern 140 may have first and second openings 141a and 141b that correspond to the end portions of the semiconductor chip 130.

The first opening 141a may have a first side S1 spaced apart from the first edge E1 of the semiconductor chip 130, a second side S2 spaced apart from the second edge E2 of the semiconductor chip 130, and a third side S3 spaced apart from the third edge E3 of the semiconductor chip 130. The second opening 141b may have a first side S1 spaced apart from the first edge E1 of the semiconductor chip 130, a second side S2 spaced apart from the second edge E2 of the semiconductor chip 130, and a third side S3 spaced apart from the fourth edge E4 of the semiconductor chip 130. The first opening 141a and second opening 141b may also be described as gaps within the heat radiation pattern 140.

As shown in FIG. 15, the first opening 141a may overlap the third chip pads 133 of the semiconductor chip 130, and the second opening 141b may overlap the fourth chip pads 134 of the semiconductor chip 130.

As shown in FIG. 16, the first opening 141a may overlap the third chip pads 133 of the semiconductor chip 130, and may overlap some (e.g., 2, 4, or more) of the first and second chip pads 131 and 132 of the semiconductor chip 130. Likewise, the second opening 141b may overlap the fourth chip pads 134 of the semiconductor chip 130, and may overlap some (e.g., 2, 4, or more) of the first and second chip pads 131 and 132 of the semiconductor chip 130.

Likewise the embodiments previously shown in FIGS. 10 to 14, the heat radiation pattern 140 and the semiconductor chip 130 illustrated in FIGS. 15 and 16 may be disposed to be misaligned with each other in the first direction D1 or the second direction D2.

Figure 17:
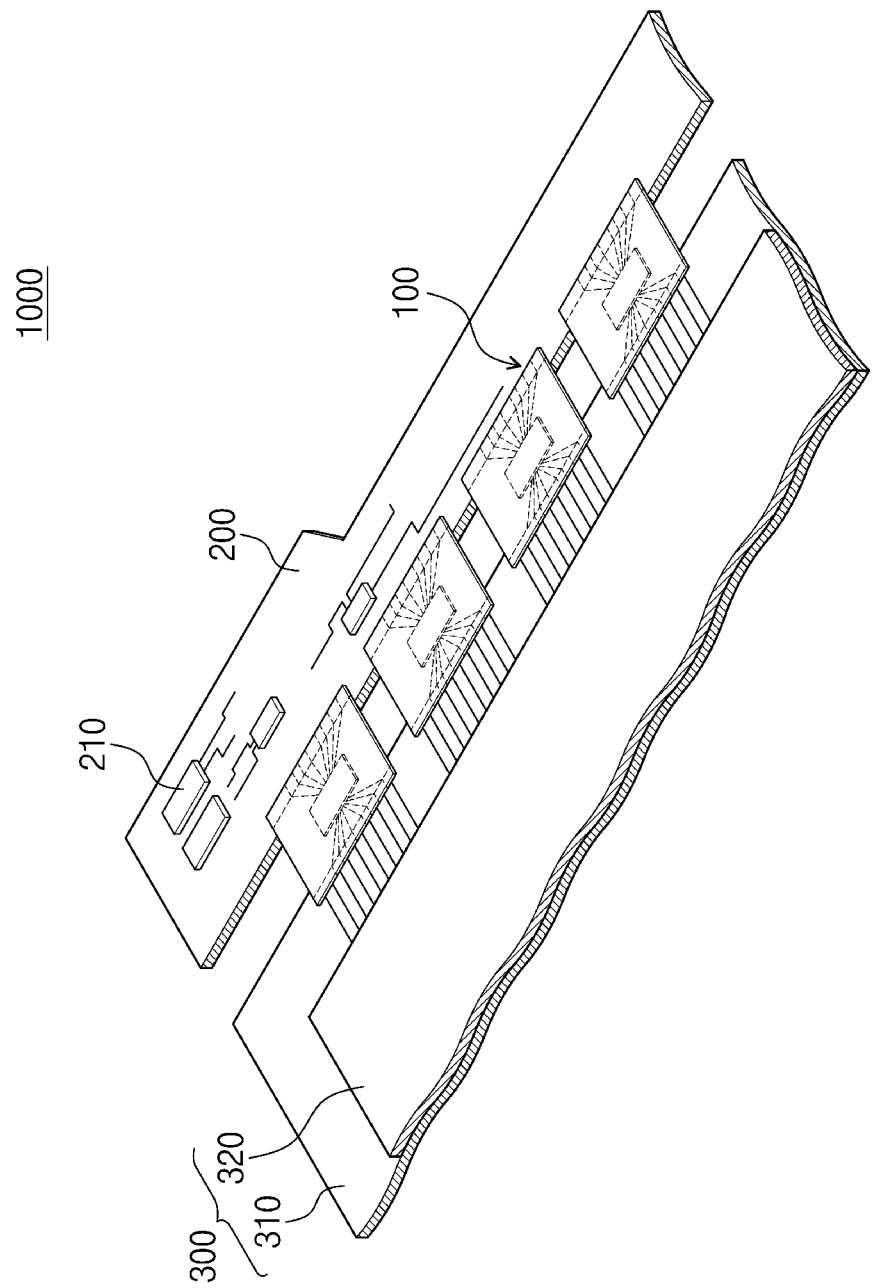
FIG. 17 illustrates a perspective view showing a display device including a semiconductor package according to some example embodiments of the present inventive concepts.

FIG. 17 illustrates a perspective view showing a display device including a semiconductor package according to some example embodiments of the present inventive concepts.

A display device 1000 may include at least one semiconductor package 100, a printed circuit board 200, and a display panel 300.

The at least one semiconductor package 100 may be connected between the printed circuit board 200 and the display panel 300. The at least one semiconductor package 100 may receive signals that are output from the printed circuit board 200, and may transfer the signals to the display panel 300. The at least one semiconductor package 100 may include a semiconductor package discussed above with reference to FIGS. 1 to 16.

The printed circuit board 200 may include an interface capable of being connected to an external processing apparatus, and may also include at least one driving component capable of simultaneously applying a power and a signal to the at least one semiconductor package 100.

The display panel 300 may include a transparent substrate 310, a display region 320 formed on the transparent substrate 310, and a plurality of panel lines. The transparent substrate 310 may be, for example, a glass substrate or a transparent flexible substrate. The display region 320 may include a plurality of pixels connected to the plurality of panel lines, and the plurality of pixels may operate in response to signals that are output from the semiconductor package 100.

The display panel 300 may be, for example, a liquid crystal display (LCD) panel, a light emitting diode (LED) panel, an organic LED panel, or a plasma display panel (PDP).

According to some example embodiments of the present inventive concepts, because a heat radiation pattern has openings that correspond to opposite end portions of a semiconductor chip, when the semiconductor chip operates, connection sections where connection terminals are coupled to input/output lines may be prevented from concentration of stress caused by expansion of the heat radiation pattern on the opposite end portions of the semiconductor chip. Therefore, it may be possible to avoid damage to the input/output lines and the connection terminals. As a result, a semiconductor package may increase in reliability.

Although the present inventive concepts have been described in connection with some example embodiments of the present inventive concepts illustrated in the accompanying drawings, it will be understood to those skilled in the art that various changes and modifications may be made without departing from the technical spirit and essential features of the present inventive concepts. It will be apparent to those skilled in the art that various substitution, modifications, and changes may be thereto without departing from the scope and spirit of the present inventive concepts.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor package, comprising:
   a base film having a first surface and a second surface opposite to the first surface;
   a plurality of input/output lines on the first surface of the base film;
   a semiconductor chip disposed on the first surface of the base film and connected to the input/output lines, the semiconductor chip including a central portion and end portions on opposite sides of the central portion and including a plurality of chip pads at a surface of the semiconductor chip, each chip pad connected to a bump or ball such that each chip pad is between the bump or ball and a portion of the semiconductor chip; and
   a heat radiation pattern on the second surface of the base film, the heat radiation pattern corresponding to the semiconductor chip and having a plurality of openings that correspond to the end portions of the semiconductor chip and that vertically overlap the end portions of the semiconductor chip and also vertically overlap the plurality of chip pads.

2. The semiconductor package of claim 1, wherein the plurality of chip pads are a plurality of second chip pads on the end portions, and the semiconductor chip includes a plurality of first chip pads on the central portion.

3. The semiconductor package of claim 2, further comprising a plurality of connection terminals between the input/output lines and the first and second chip pads.

4. The semiconductor package of claim 1,
   wherein the semiconductor chip has:
     first and second edges opposite to each other; and
     third and fourth edges opposite to each other and perpendicular to the first and second edges, and
   wherein each of the openings has:
     a first side spaced apart from the first edge;

a second side spaced apart from the second edge; and
third and fourth sides that are opposite to each other and spaced apart from the third edge or the fourth edge.

5. The semiconductor package of claim 4, wherein a first distance between the first side and the first edge and a second distance between the third side and the third edge for at least one of the openings are each in a range of about 1.0 μm to about 2.5 μm.

6. The semiconductor package of claim 4, wherein a first distance between the first side and the first edge is different from a second distance between the third side and the third edge for at least one of the openings.

7. The semiconductor package of claim 4, wherein
the first and second edges of the semiconductor chip have a first length,
the third and fourth edges of the semiconductor chip have a first width, and
the first length is between about 5 times and about 15 times the first width.

8. The semiconductor package of claim 1, wherein, when viewed in a first direction,
the base film has a first length,
the semiconductor chip has a second length, and
the heat radiation pattern has a third length less than the first length and greater than the second length.

9. The semiconductor package of claim 8, wherein, when viewed in a second direction perpendicular to the first direction,
the semiconductor chip has a first width, and
the heat radiation pattern has a second width greater than the first width.

10. The semiconductor package of claim 1, wherein the heat radiation pattern is a sheet having a thickness in a range of about 15 μm to about 50 μm.

11. The semiconductor package of claim 1, wherein the heat radiation pattern includes:
a plurality of first portions that have a first length in a first direction and spaced apart from each other in a second direction perpendicular to the first direction,
a second portion between the first portions and having a second length less than the first length,
wherein the second portion of the heat radiation pattern overlaps the central portion of the semiconductor chip.

12. The semiconductor package of claim 1,
wherein the semiconductor chip has:
first and second edges opposite to each other; and
third and fourth edges opposite to each other and perpendicular to the first and second edges, and
wherein each of the openings has:
a first side spaced apart from the first edge;
a second side spaced apart from the second edge; and
a third side spaced apart from the third edge or the fourth edge.

13. The semiconductor package of claim 1, wherein the semiconductor chip has:
a first edge spaced apart at a first distance from a first side of the base film; and
a second edge spaced apart from at a second distance from a second side of the base film, the second distance different from the first distance.

14. The semiconductor package of claim 13, wherein the heat radiation pattern has:
a third edge spaced apart at a third distance from the first side of the base film; and
a fourth edge spaced apart at a fourth distance from the second side of the base film,
wherein the third distance is less than the first distance,
wherein the fourth distance is less than the second distance, and
wherein the third distance is substantially the same as the fourth distance.

15. A semiconductor package, comprising:
a base film having a first surface and a second surface opposite to the first surface;
a semiconductor chip on the first surface of the base film, the semiconductor chip having a length in a first direction and a width in a second direction perpendicular to the first direction, the width less than the length; and
a heat radiation pattern on the second surface of the base film,
wherein the semiconductor chip includes:
a plurality of first chip pads adjacent to a first edge of the semiconductor chip parallel to the second direction, and a plurality of first bumps or balls formed on a bottom surface of the plurality of first chip pads; and
a plurality of second chip pads adjacent to a second edge of the semiconductor chip opposite to the first edge, and a plurality of second bumps or balls formed on a bottom surface of the plurality of second chip pads,
wherein the heat radiation pattern has:
a first opening that vertically overlaps the first chip pads of the semiconductor chip and the first edge of the semiconductor chip; and
a second opening that vertically overlaps the second chip pads of the semiconductor chip and the second edge of the semiconductor chip, and
wherein each of the first and second openings has an opening length in the second direction, the opening length greater than the width of the semiconductor chip.

16. A semiconductor package, comprising:
a base film having a first surface and a second surface opposite to the first surface;
a plurality of input/output lines on the first surface of the base film;
a semiconductor chip on the first surface of the base film and connected to the input/output lines, the semiconductor chip including: first and second edges opposite to each other; third and fourth edges perpendicular to the first and second edges and opposite to each other, the first and second edges being longer than the third and fourth edges; and
a heat radiation sheet on the second surface of the base film, the heat radiation sheet corresponding to the semiconductor chip,
wherein the semiconductor chip includes: a plurality of first chip pads arranged adjacent to the first and second edges; and a plurality of second chip pads arranged adjacent to the third and fourth edges, wherein a plurality of bumps or balls are formed on bottom surfaces of the first chip pads and second chip pads,
wherein the heat radiation sheet has a first opening and a second opening that partially expose the base film,
wherein the first opening vertically overlaps the second chip pads adjacent to the third edge and overlaps the third edge, and
wherein the second opening vertically overlaps the second chip pads adjacent to the fourth edge and overlaps the fourth edge.

17. The semiconductor package of claim 16, wherein each of the first and second openings has:

a first side spaced apart from the first edge of the semiconductor chip; and a second side spaced apart from the third edge of the semiconductor chip.

18. The semiconductor package of claim 17, wherein a first distance between the first side and the first edge and a second distance between the second side and the third edge are each in a range of about 1.0 μm to about 2.5 μm.

19. The semiconductor package of claim 16, wherein, when viewed in a first direction, the base film has a first length, the semiconductor chip has a second length, and the heat radiation sheet has a third length less than the first length and greater than the second length.

20. The semiconductor package of claim 16, wherein the first and second edges have a first length the third and fourth edges have a first width, and the first length is about 5 to 15 times the first width.

* * * * *